(12) United States Patent
Zhang et al.

(10) Patent No.: US 8,410,813 B2
(45) Date of Patent: Apr. 2, 2013

(54) METHOD AND APPARATUS FOR A LOW POWER AC ON-DIE-TERMINATION (ODT) CIRCUIT

(75) Inventors: Liang Leon Zhang, Duluth, GA (US); Suresh Atluri, Duluth, GA (US); Yue Yu, Duluth, GA (US); Al Xuefeng Fang, Duluth, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 13/114,970

(22) Filed: May 24, 2011

(65) Prior Publication Data

US 2012/0299617 A1   Nov. 29, 2012

(51) Int. Cl.
*H03K 19/003* (2006.01)
(52) U.S. Cl. .......................................................... 326/30
(58) Field of Classification Search ........................ None
See application file for complete search history.

(56) References Cited

U.S. PATENT DOCUMENTS 3,986,043 A * 10/1976 Buckley et al. ................ 326/121
6,930,507 B2 * 8/2005 Dreps et al. ..................... 326/30

* cited by examiner

*Primary Examiner* — Crystal L Hammond
(74) *Attorney, Agent, or Firm* — Heimlich Law, PC; Alan Heimlich, Esq.

(57) ABSTRACT

A method and apparatus for A Low Power AC On-Die-Termination (ODT) Circuit using active components reduces receiver power consumption.

16 Claims, 11 Drawing Sheets

1000

1. A circuit on an integrated circuit comprising:
   a first resistor having an input and an output, said first resistor input coupled to receive an input;
   a first n-channel transistor having a drain, a gate, and a source, said first n-channel gate connected to said first resistor output, and said first n-channel drain connected to said first resistor output;
   a second resistor having an input and an output, said second resistor input connected to said first transistor source;
   a second n-channel transistor having a drain, a gate, and a source, said second n-channel transistor drain connected to said second resistor output;
   a first p-channel transistor having a source, a gate, and a drain, said first p-channel transistor gate connected to said first resistor input, and said first p-channel transistor drain connected to said first resistor output;
   a third resistor having an input and an output, said third resistor input connected to said first p-channel transistor source; and
   a second p-channel transistor having a source, a gate, and a drain, said second p-channel transistor drain connected to said third resistor output.

2. The circuit of claim 1 further comprising:
   a third n-channel transistor having a drain, a gate, and a source, said third n-channel transistor source connected to said second n-channel transistor source; and
   a fourth resistor having an input and an output, said fourth resistor input connected to said second resistor input, and said fourth resistor output connected to said third n-channel drain.

3. The circuit of claim 2 further comprising:
   a third p-channel transistor having a source, a gate, and a drain, said third p-channel transistor source connected to said second p-channel transistor source; and
   a fifth resistor having an input and an output, said fifth resistor input connected to said third resistor input, and said fifth resistor output connected to said third p-channel drain.

4. The circuit of claim 3 further comprising:
   a fourth n-channel transistor having a drain, a gate, and a source, said fourth n-channel transistor source connected to said second n-channel transistor source; and
   a fifth resistor having an input and an output, said fifth resistor input connected to said second resistor input, and said fifth resistor output connected to said fourth n-channel drain.

5. The circuit of claim 4 further comprising:
   a fourth p-channel transistor having a source, a gate, and a drain, said fourth p-channel transistor source connected to said second p-channel transistor source; and
   a sixth resistor having an input and an output, said sixth resistor input connected to said third resistor input, and said sixth resistor output connected to said fourth p-channel drain.

6. The circuit of claim 5 further comprising:
   a fifth n-channel transistor having a drain, a gate, and a source, said fifth n-channel transistor source connected to said second n-channel transistor source; and
   a sixth resistor having an input and an output, said sixth resistor input connected to said second resistor input, and said sixth resistor output connected to said fifth n-channel drain.

7. The circuit of claim 6 further comprising:
   a fifth p-channel transistor having a source, a gate, and a drain, said fifth p-channel transistor source connected to said second p-channel transistor source; and
   a seventh resistor having an input and an output, said seventh resistor input connected to said third resistor input, and said seventh resistor output connected to said fifth p-channel drain.

8. The circuit of claim 1 further comprising a first capacitor having an input and an output, said first capacitor input connected to said first resistor input, and said first capacitor output connected to said second n-channel transistor source.

9. The circuit of claim 8 further comprising a second capacitor having an input and an output, said second capacitor input connected to said first resistor output, and said second capacitor output connected to said second n-channel transistor source.

10. The circuit of claim 1 further comprising a second capacitor having an input and an output, said second capacitor input connected to said first resistor output, and said second capacitor output connected to said second n-channel transistor source.

11. A method comprising using an alternating current (AC) on-die-termination (ODT) for a receiver.

12. The method of claim 11 further comprising using an AC ODT for a driver.

13. The method of claim 12 wherein said receiver and said driver are on a same die as said receiver AC ODT and said driver AC ODT.

14. The method of claim 11 further comprising using a degeneration circuit to reduce gm variation in one or more transistors.

FIG. 10

15. The method of claim 14 further comprising using a calibration circuit to balance p-channel metal oxide semiconductor and n-channel metal oxide semiconductor variation.

16. The method of claim 15 further comprising using said calibration circuit to build a voltage reference.

17. The method of claim 16 wherein said voltage reference is on-half of a supply voltage.

18. An apparatus comprising:
   means for receiving a double data rate memory output at a receiver input on an integrated circuit; and
   means for alternating current electrically terminating said receiver input to provide a substantially same impedance as a passive electrical termination.

19. The apparatus of claim 18 further comprising:
   means for using a plurality of resistively connected n-channel transistors to calibrate a first n-channel transistor; and
   means for using a plurality of resistively connected p-channel transistors to calibrate a first p-channel transistor.

20. The apparatus of claim 19 further comprising means for producing an output from said receiver input selected from the group consisting of: using said receiver input, using an output derived from said receiver input, and using a differential signal consisting of an output derived from said receiver input and a reference voltage.

METHOD AND APPARATUS FOR A LOW POWER AC ON-DIE-TERMINATION (ODT) CIRCUIT

RELATED APPLICATION

This application is related to application Ser. No. 13/114, 960 filed this same date titled "Method and Apparatus for An Equalized On-Die Termination (ODT) Circuit", which is hereby incorporated herein by reference in its entirety including all incorporated references therein.

FIELD OF THE INVENTION

The present invention pertains to on die (also denoted on-die) termination. More particularly, the present invention relates to a Method and Apparatus for A Low Power AC On-Die-Termination (ODT) Circuit.

BACKGROUND OF THE INVENTION

FIG. 3A illustrates a conventional passive resistor ODT.

In high-speed data transfer designs, ODT is used on the receiver end to minimize reflections and improve signal integrity. Often high-speed ODT designs are simple passive resistors which result in constant DC power. This DC power turns out to be significant especially in memory product applications due to the fact that there are a large number of I/O's. This presents a problem.

BRIEF DESCRIPTION OF THE DRAWINGS

The invention is illustrated by way of example and not limitation in the figures of the accompanying drawings in which:

FIG. 10 shows various embodiments of the invention; and

FIG. 11 shows various embodiments of the invention.

DETAILED DESCRIPTION

In one embodiment of the invention, using the disclosed techniques an AC (alternating current) on-die-termination (ODT) topology to reduce ODT power dissipation by above 50% is possible compared to a conventional passive ODT topology.

In one embodiment of the invention, AC on-die-termination (ODT) is used to reduce the DC power dissipation in the ODT circuits without impacting the signal integrity of the system.

In one embodiment of the invention, DC power dissipation in the ODT circuits can be reduced by increasing the DC resistance and largely shutting off the DC path between power and ground.

Figure 3:
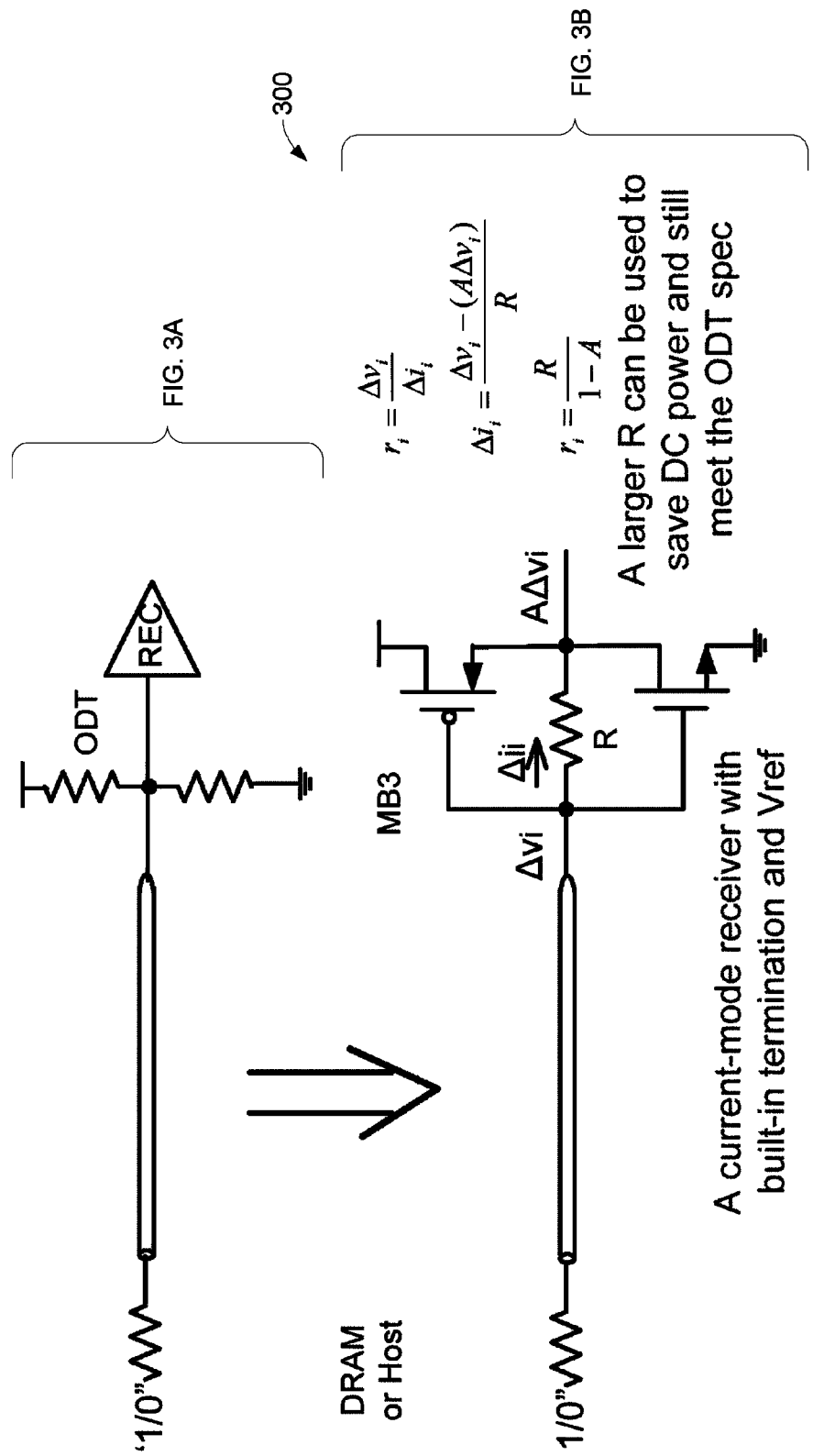
FIG. 3A illustrates a conventional passive resistor ODT verses one embodiment of the invention illustrated in FIG. 3B.

FIG. 3A illustrates a conventional passive resistor ODT versus one embodiment of the invention illustrated in FIG. 3B;

FIG. 3B, illustrates generally at 300, one embodiment of the invention showing a simple version of a schematic to implement one of the proposed AC on-die-termination (ODT) techniques.

The implementation disclosed at FIG. 3B is an AC ODT used to minimize signal reflection and a highly resistive DC path is built up to minimize DC power consumption.

Figure 4:
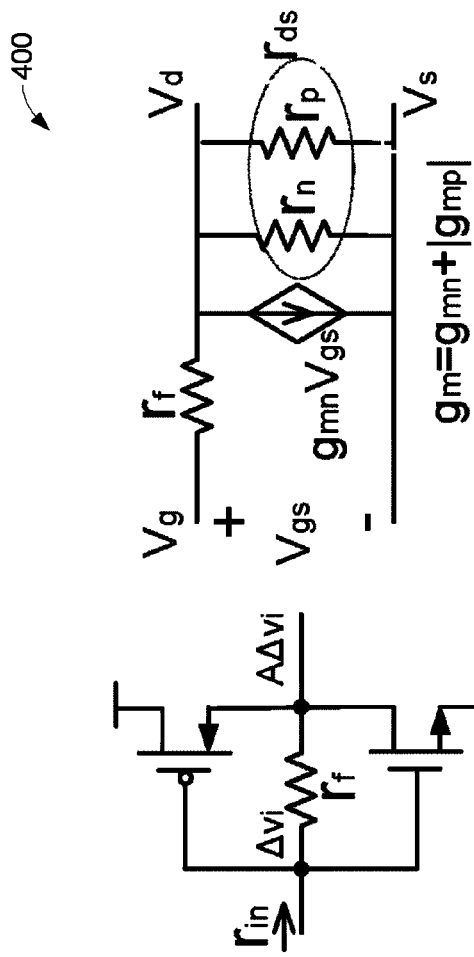
FIG. 4 illustrates a small signal analysis of one embodiment of the AC ODT circuit.

FIG. 4 illustrates, generally at 400, a small signal analysis of one embodiment of the AC ODT circuit. As may be seen, the AC ODT resistance is not determined by the resistor anymore, but rather the gm of the transistors.

Figure 5:
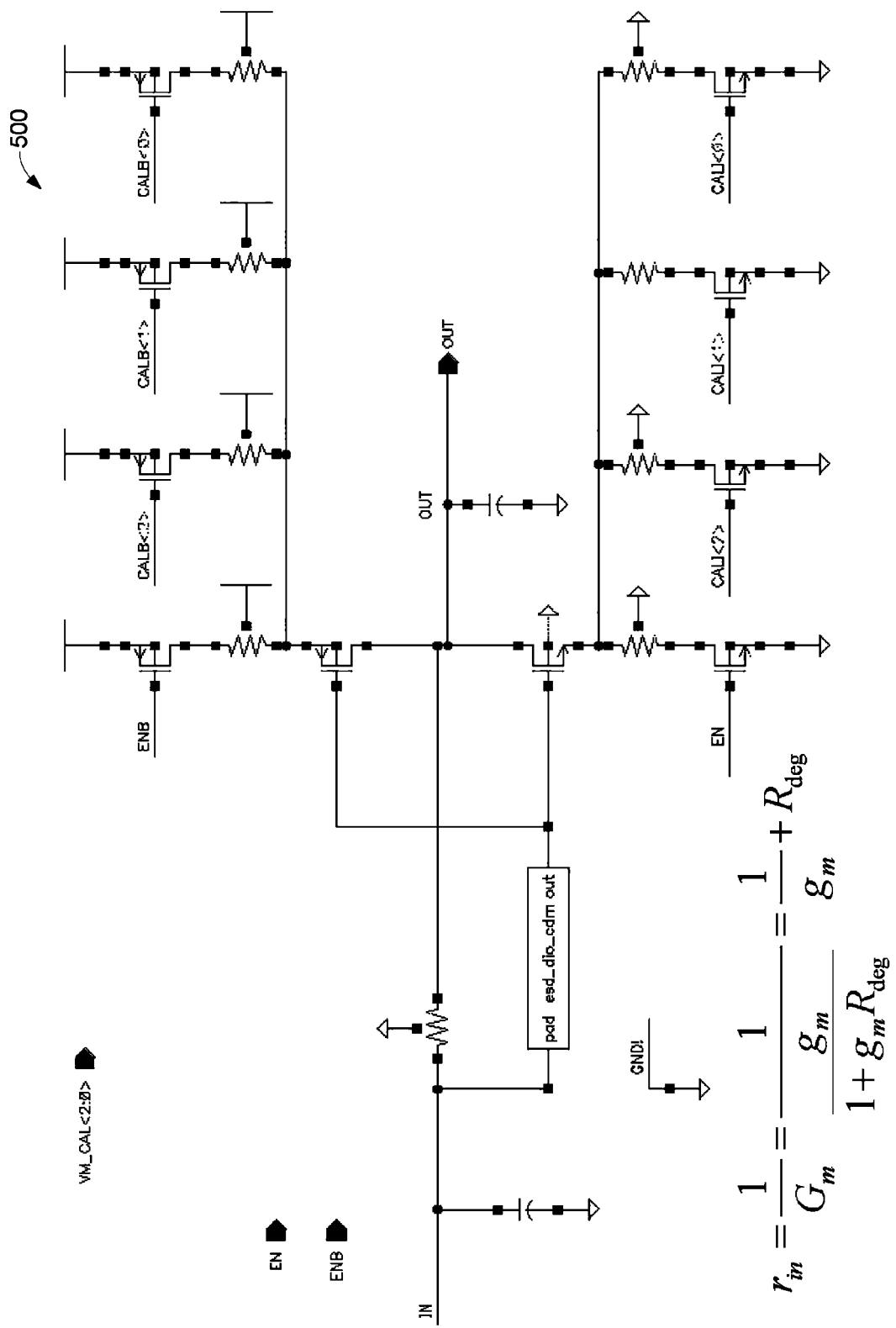
FIG. 5 illustrates shows one circuit implementation of a 120 ohm AC ODT with degeneration and calibration.

FIG. 5 illustrates, generally at 500, one embodiment of the invention showing a circuit implementation of a 120 ohm active AC ODT with degeneration and calibration. The degeneration circuit is used to reduce the gm variation at different process corners and the calibration circuit is used to balance the PMOS and NMOS variation for a VDD/2 built-in Vref.

In FIG. 5 the following reference characters are:
VM_CAL<2:0>—a calibration signal of width 3
EN—an enable signal
ENB—the inverted version of EN
GND!—a ground reference
pad esd_dio_cdm out—a pad having ESD (electrostatic discharge) protection
IN—an input
OUT—an output
CALB<0>—a calibration signal
CALB<1>—a calibration signal
CALB<2>—a calibration signal
CAL1<0>—a calibration signal
CAL1<1>—a calibration signal
CAL1<2>—a calibration signal FIG. 5 shows generally at 500 an embodiment of the invention as follows.

Claim 1. A circuit on an integrated circuit comprising:
a first resistor having an input and an output, said first resistor input coupled to receive an input;
a first n-channel transistor having a drain, a gate, and a source, said first n-channel gate connected to said first resistor output, and said first n-channel drain connected to said first resistor output;
a second resistor having an input and an output, said second resistor input connected to said first transistor source;
a second n-channel transistor having a drain, a gate, and a source, said second n-channel transistor drain connected to said second resistor output;
a first p-channel transistor having a source, a gate, and a drain, said first p-channel transistor gate connected to said first resistor input, and said first p-channel transistor drain connected to said first resistor output;
a third resistor having an input and an output, said third resistor input connected to said first p-channel transistor source; and a second p-channel transistor having a source, a gate, and a drain, said second p-channel transistor drain connected to said third resistor output.

Claim 2. The circuit of claim 1 further comprising:
a third n-channel transistor having a drain, a gate, and a source, said third n-channel transistor source connected to said second n-channel transistor source; and a fourth resistor having an input and an output, said fourth resistor input connected to said second resistor input, and said fourth resistor output connected to said third n-channel drain.

Claim 3. The circuit of claim 2 further comprising:
a third p-channel transistor having a source, a gate, and a drain, said third p-channel transistor source connected to said second p-channel transistor source; and
a fifth resistor having an input and an output, said fifth resistor input connected to said third resistor input, and said fifth resistor output connected to said third p-channel drain.

Claim 4. The circuit of claim 3 further comprising:
a fourth n-channel transistor having a drain, a gate, and a source, said fourth n-channel transistor source connected to said second n-channel transistor source; and
a fifth resistor having an input and an output, said fifth resistor input connected to said second resistor input, and said fifth resistor output connected to said fourth n-channel drain.

Claim 5. The circuit of claim 4 further comprising:
a fourth p-channel transistor having a source, a gate, and a drain, said fourth p-channel transistor source connected to said second p-channel transistor source; and
a sixth resistor having an input and an output, said sixth resistor input connected to said third resistor input, and said sixth resistor output connected to said fourth p-channel drain.

Claim 6. The circuit of claim 5 further comprising:
a fifth n-channel transistor having a drain, a gate, and a source, said fifth n-channel transistor source connected to said second n-channel transistor source; and
a sixth resistor having an input and an output, said sixth resistor input connected to said second resistor input, and said sixth resistor output connected to said fifth n-channel drain.

Claim 7. The circuit of claim 6 further comprising:
a fifth p-channel transistor having a source, a gate, and a drain, said fifth p-channel transistor source connected to said second p-channel transistor source; and
a seventh resistor having an input and an output, said seventh resistor input connected to said third resistor input, and said seventh resistor output connected to said fifth p-channel drain.

Claim 8. The circuit of claim 1 further comprising a first capacitor having an input and an output, said first capacitor input connected to said first resistor input, and said first capacitor output connected to said second n-channel transistor source.

Claim 9. The circuit of claim 8 further comprising a second capacitor having an input and an output, said second capacitor input connected to said first resistor output, and said second capacitor output connected to said second n-channel transistor source.

Claim 10. The circuit of claim 1 further comprising a second capacitor having an input and an output, said second capacitor input connected to said first resistor output, and said second capacitor output connected to said second n-channel transistor source.

Figure 6:
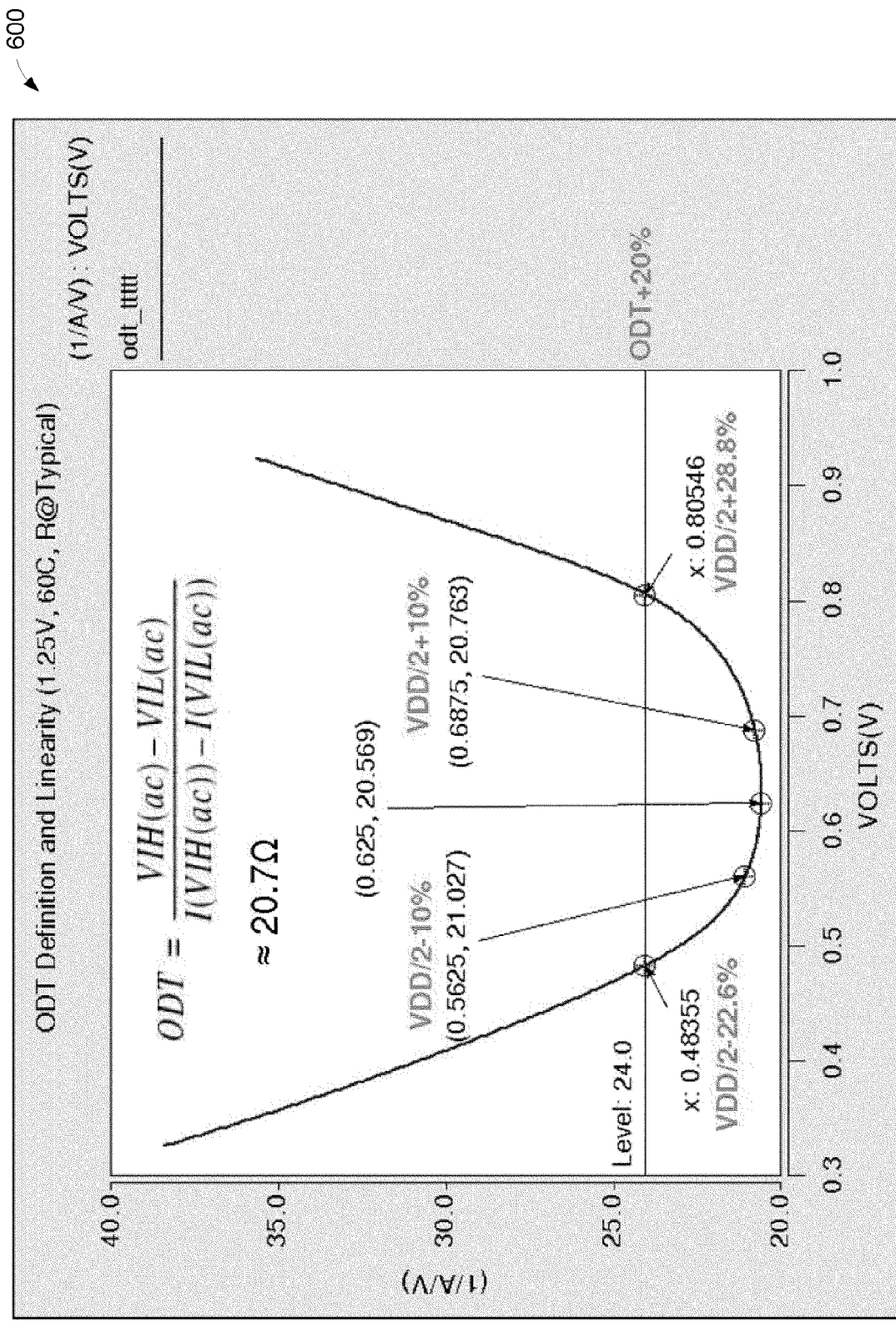
FIG. 6 illustrates ODT definition and linearity.

FIG. 6 illustrates, generally at 600, ODT definition and linearity.

FIG. 6 shows the AC ODT resistance with a 20 ohm setting, a combination of 6 120 ohm AC ODT (i.e. in parallel). The AC ODT easily meets the ODT SPEC.

Figure 7:
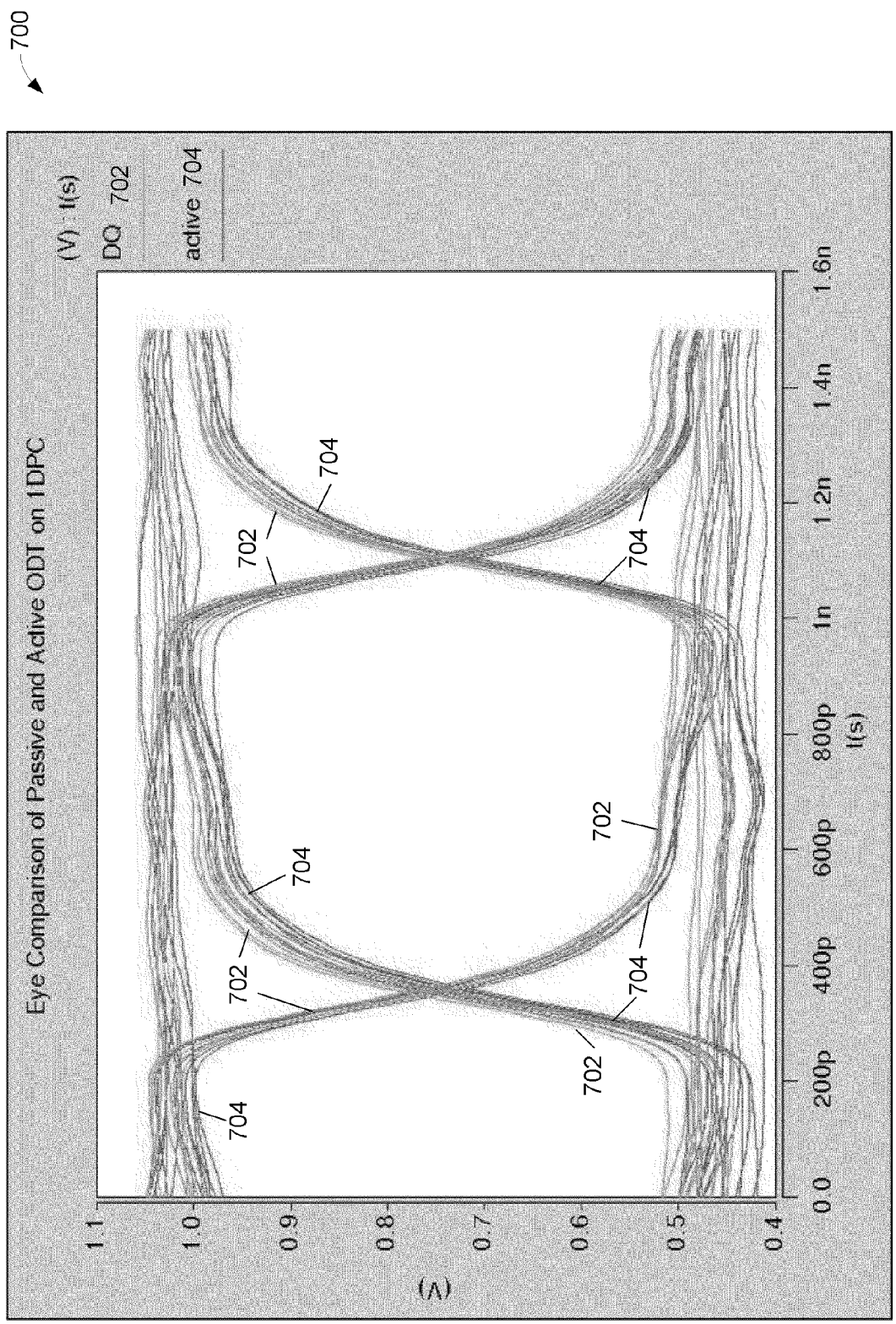
FIG. 7 shows the AC ODT has the same signal integrity performance in an Intel CPU-memory platform as a passive ODT does.

FIG. 7 illustrates, generally at 700, that the AC ODT 704 has the same signal integrity performance in an Intel CPU-memory platform as a passive ODT 704 does. What determines the signal reflection is the AC termination resistance. FIG. 7 shows how nearly indistinguishable the passive 702 and active 704 eye patterns are. FIG. 7 illustrates a host write to a memory buffer for DDR3 (double data rate type three synchronous dynamic random access memory) memory (MB3, also denoted mb3).

Figure 8:
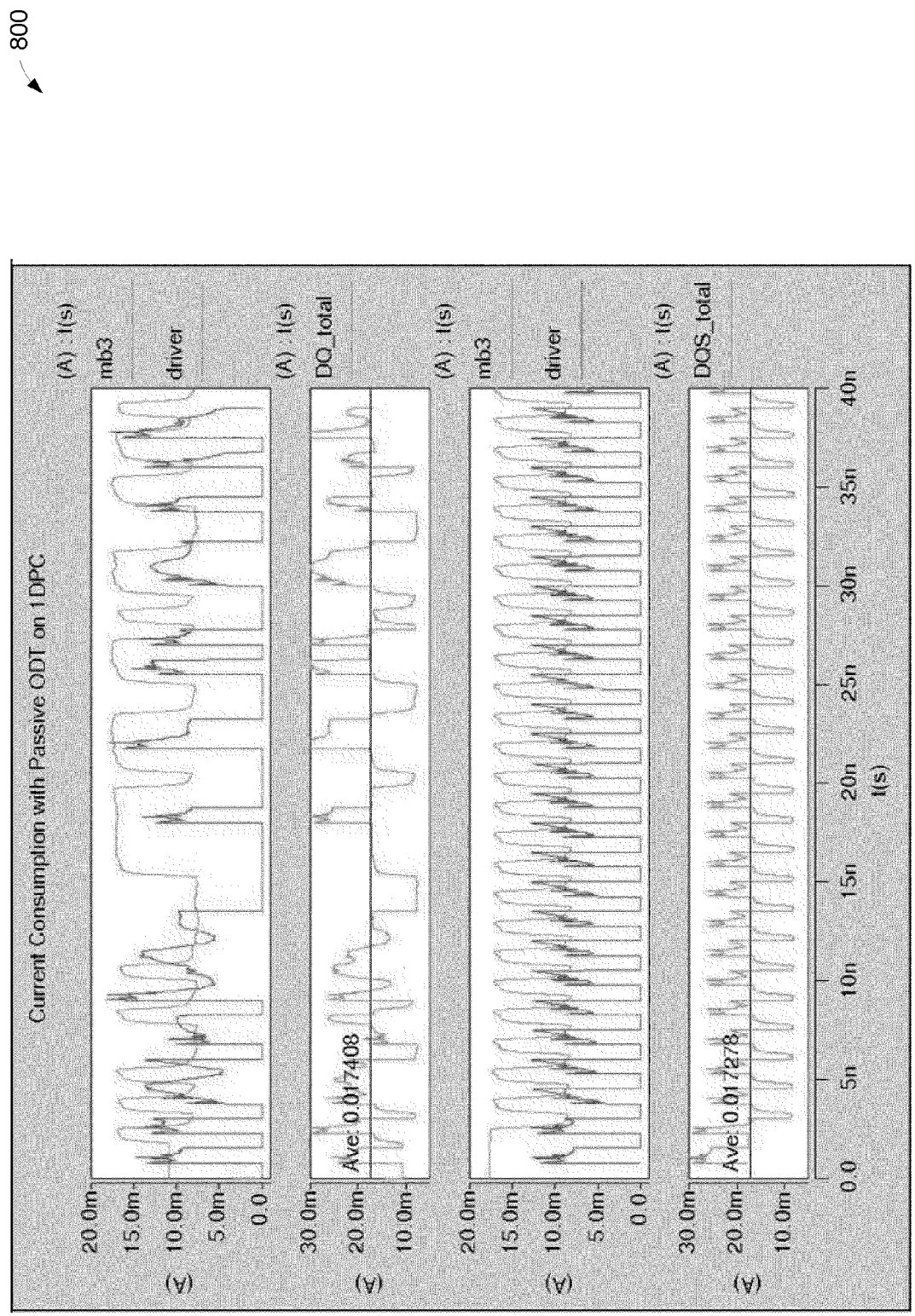
FIG. 8 shows the driver and receiver current consumption with a passive ODT in an Intel CPU-memory platform.

FIG. 8 illustrates, generally at 800, the driver and receiver current consumption with a passive ODT in an Intel CPU-memory platform. The current consumption of a random data channel (DQ) is shown at the top and the current consumption of a clock (DQS) is shown at the bottom.

Figure 9:
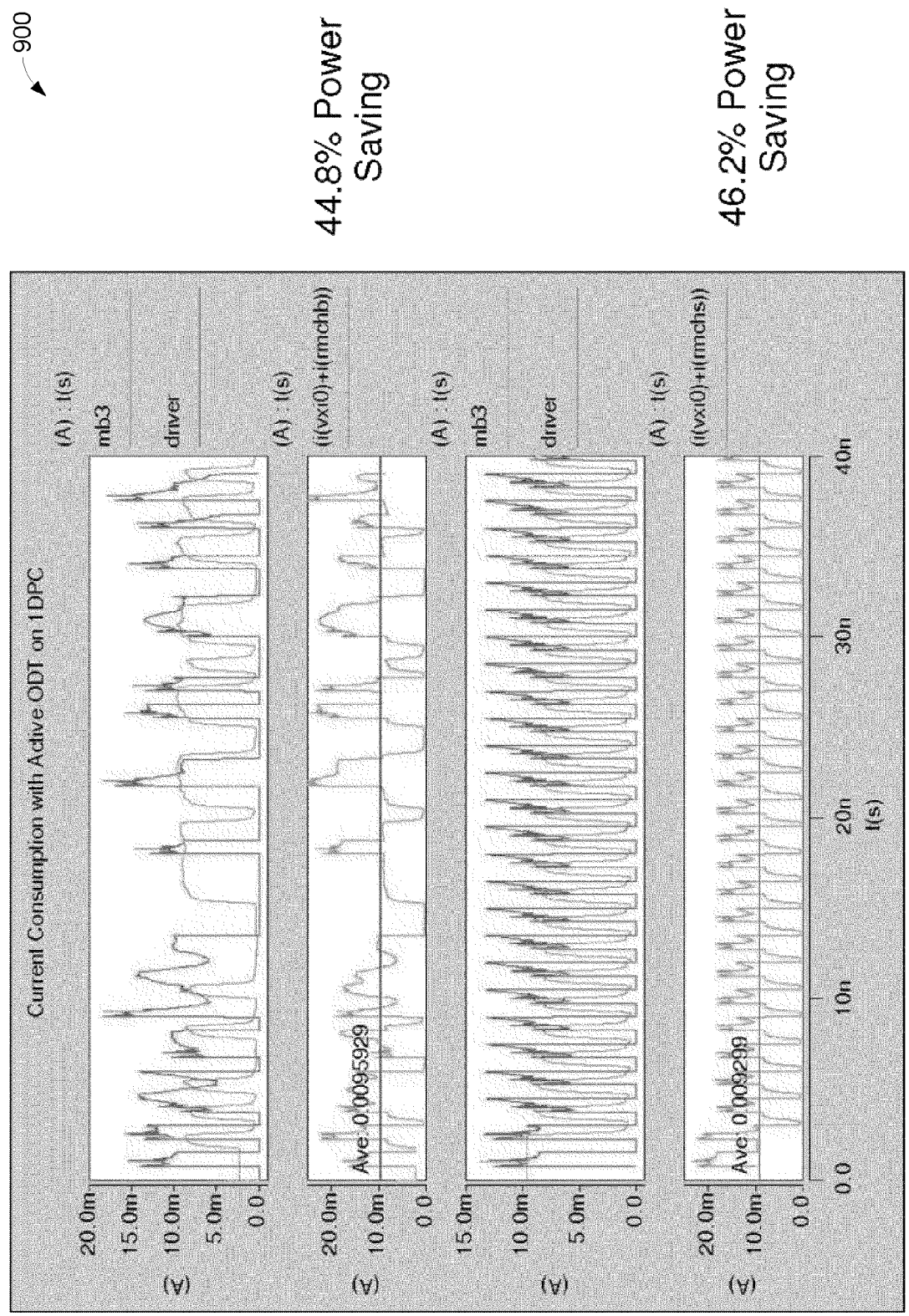
FIG. 9 illustrates the driver and receiver current consumption with an AC ODT in an Intel CPU-memory platform.

FIG. 9 illustrates, generally at 900, one embodiment of the invention showing the driver and receiver current consumption with the AC ODT in an Intel CPU-memory platform. Above 40% transceiver power savings are shown for one channel. In other words, above 50% receiver (ODT) power savings without causing any extra driver power increase.

In one embodiment of the invention, the AC ODT for a receiver is used in place of a passive ODT.

In one embodiment of the invention, where an AC ODT in a receiver is used in place of a passive ODT, the signal from the AC ODT input may be sent to the next stage differential amplifier with VREF.

In another embodiment of the invention, the signal from the AC ODT output may be used for the next stage differential amplifier with VREF.

In another embodiment of the invention, the signal is compared with the built-in VREF of the AC ODT output directly and amplified for the next stage.

In one embodiment of the invention the techniques disclosed are used for registers, for example, in DDR (double data rate) products.

FIG. 10 shows, generally at 1000, various embodiments of the invention.

FIG. 11 shows, generally at 1100, various embodiments of the invention.

While the above description deals with ODT, it is to be understood that the invention is not so limited and that the techniques described herein may be used wherever an electrical termination may be needed, for example, but not limited to, a printed circuit board (PCB), substrates other than silicon—such as ceramics, microwave terminations, etc. For example, the techniques disclosed may be used on a backplane which may be a PCB, a wire wrap, a busbar, etc.

Thus a method and apparatus for A Low Power AC On-Die-Termination (ODT) Circuit have been described.

Figure 1:
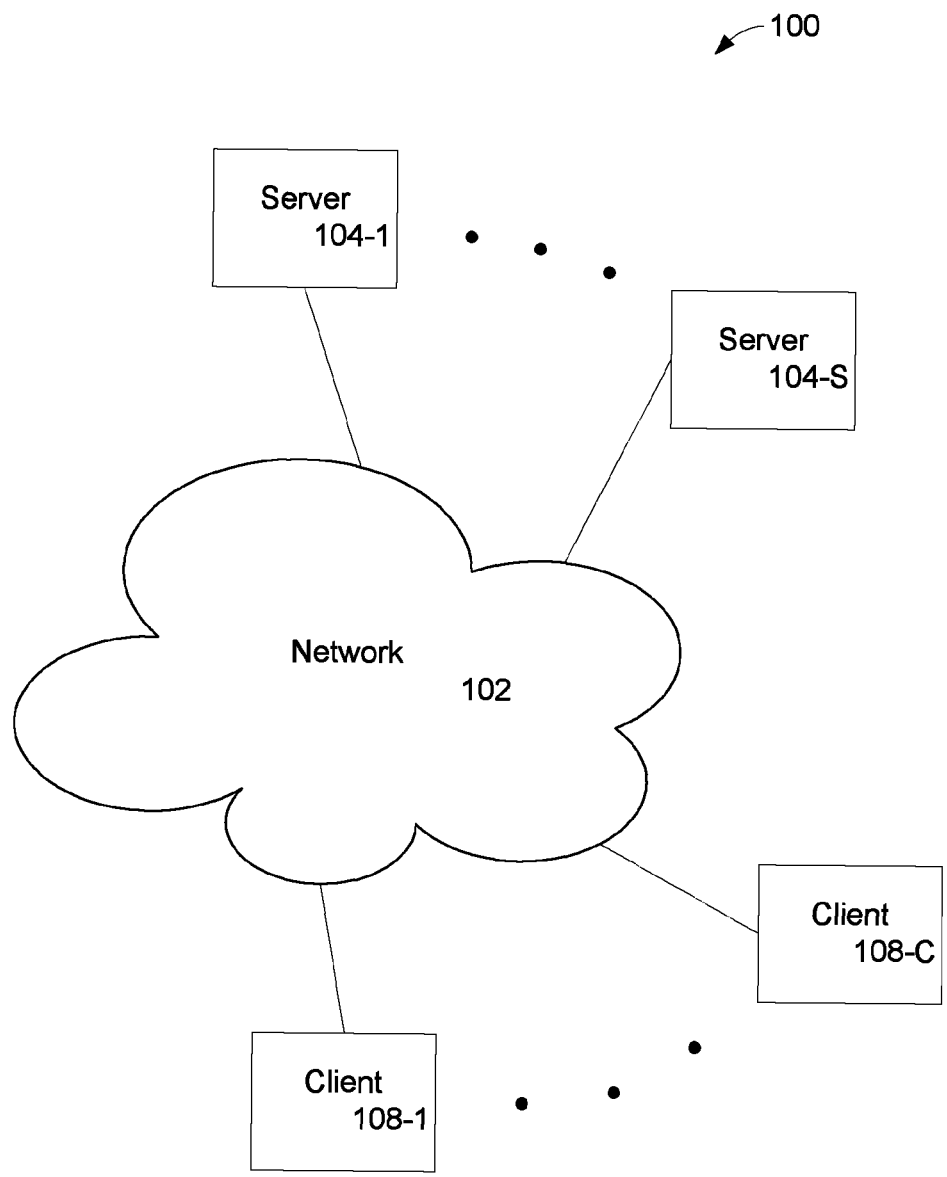
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
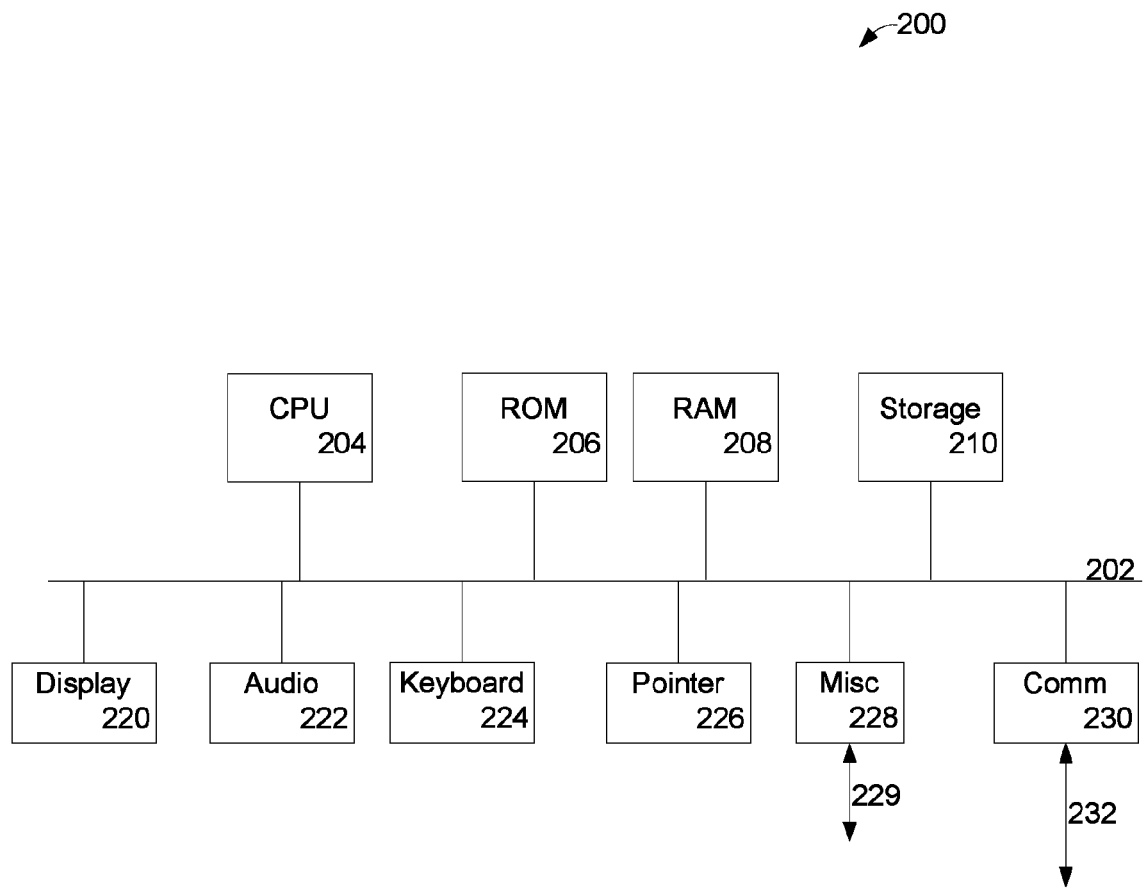
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio 222, keyboard 224, pointer 226, miscellaneous input/output (I/O) devices 228, link 229, communications 230, and port 232. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; mechanical, electrical, optical, acoustical or other forms of non-transitory signals.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

As used in this description MB3 refers to a memory buffer which may be used, for example, with DDR3 memory (double data rate type three synchronous dynamic random access memory).

As used in this description "die", "on-die", and "IC" and are used to indicate components on an integrated circuit unless noted otherwise.

As used in this description and the claims, references to component(s) are used to indicate fabricated component(s) not intrinsic devices. For example, reference to a capacitor, refers to a fabricated capacitor not an intrinsic capacitance of another component or wiring. For example, reference to a resistor, refers to a fabricated resistor not an intrinsic resistance of another component or wiring.

It is to be understood that in any one or more embodiments of the invention where alternative approaches or techniques are discussed that any and all such combinations as might be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for A Low Power AC On-Die-Termination (ODT) Circuit have been described.

What is claimed is:

1. A circuit on an integrated circuit comprising:
   a first resistor having an input and an output, said first resistor input coupled to receive an input;
   a first n-channel transistor having a drain, a gate, and a source, said first n-channel gate connected to said first resistor input, and said first n-channel drain connected to said first resistor output;
   a second resistor having an input and an output, said second resistor input connected to said first n-channel transistor source;
   a second n-channel transistor having a drain, a gate, and a source, said second n-channel transistor drain connected to said second resistor output;
   a first p-channel transistor having a source, a gate, and a drain, said first p-channel transistor gate connected to said first resistor input, and said first p-channel transistor drain connected to said first resistor output;
   a third resistor having an input and an output, said third resistor input connected to said first p-channel transistor source; and
   a second p-channel transistor having a source, a gate, and a drain, said second p-channel transistor drain connected to said third resistor output.

2. The circuit of claim 1 further comprising:
   a third n-channel transistor having a drain, a gate, and a source, said third n-channel transistor source connected to said second n-channel transistor source; and
   a fourth resistor having an input and an output, said fourth resistor input connected to said second resistor input, and said fourth resistor output connected to said third n-channel transistor drain.

3. The circuit of claim 2 further comprising:
   a third p-channel transistor having a source, a gate, and a drain, said third p-channel transistor source connected to said second p-channel transistor source; and
   a fifth resistor having an input and an output, said fifth resistor input connected to said third resistor input, and said fifth resistor output connected to said third p-channel transistor drain.

4. The circuit of claim 3 further comprising:
   a fourth n-channel transistor having a drain, a gate, and a source, said fourth n-channel transistor source connected to said second n-channel transistor source; and
   a sixth resistor having an input and an output, said sixth resistor input connected to said second resistor input, and said sixth resistor output connected to said fourth n-channel transistor drain.

5. The circuit of claim 4 further comprising:
   a fourth p-channel transistor having a source, a gate, and a drain, said fourth p-channel transistor source connected to said second p-channel transistor source; and
   a seventh resistor having an input and an output, said seventh resistor input connected to said third resistor input, and said seventh resistor output connected to said fourth p-channel transistor drain.

6. The circuit of claim 5 further comprising:

a fifth n-channel transistor having a drain, a gate, and a source, said fifth n-channel transistor source connected to said second n-channel transistor source; and an eighth resistor having an input and an output, said eighth resistor input connected to said second resistor input, and said eighth resistor output connected to said fifth n-channel transistor drain.

7. The circuit of claim 6 further comprising:

a fifth p-channel transistor having a source, a gate, and a drain, said fifth p-channel transistor source connected to said second p-channel transistor source; and a ninth resistor having an input and an output, said ninth resistor input connected to said third resistor input, and said ninth resistor output connected to said fifth p-channel transistor drain.

8. The circuit of claim 1 further comprising a first capacitor having an input and an output, said first capacitor input connected to said first resistor input, and said first capacitor output connected to said second n-channel transistor source.

9. The circuit of claim 8 further comprising a second capacitor having an input and an output, said second capacitor input connected to said first resistor output, and said second capacitor output connected to said second n-channel transistor source.

10. The circuit of claim 1 further comprising a second capacitor having an input and an output, said second capacitor input connected to said first resistor output, and said second capacitor output connected to said second n-channel transistor source.

11. A method comprising using an alternating current (AC) on-die-termination (ODT) for a receive and using a degeneration circuit to reduce gm variation in one or more transistors.

12. The method of claim 11 further comprising using a calibration circuit to balance p-channel metal oxide semiconductor and n-channel metal oxide semiconductor variation.

13. The method of claim 12 further comprising using said calibration circuit to build a voltage reference.

14. The method of claim 13 wherein said voltage reference is one-half of a supply voltage.

15. An apparatus comprising:

means for receiving a double data rate memory output at a receiver input on an integrated circuit; and means for alternating current electrically termination said receiver input to provide a substantially same impedance as a passive electrical termination;

means for using a plurality of resistively connected n-channel transistors to calibrate a first n-channel transistor; and means for using a plurality of resistively connected p-channel transistors to calibrate a first p-channel transistor.

16. The apparatus of claim 15 further comprising means for producing an output from said receiver input selected from the group consisting of: using said receiver input, using an output derived from said receiver input, and using a differential signal consisting of an output derived from said receiver input and a reference voltage.

* * * * *